(12) United States Patent
Luo et al.

(10) Patent No.: US 11,848,290 B2
(45) Date of Patent: Dec. 19, 2023

(54) SEMICONDUCTOR STRUCTURE

(71) Applicant: REALTEK SEMICONDUCTOR CORPORATION, Hsinchu (TW)

(72) Inventors: Cheng-Wei Luo, Hsinchu (TW); Chieh-Pin Chang, Hsinchu (TW); Kai-Yi Huang, Hsinchu (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 262 days.

(21) Appl. No.: 17/219,136

(22) Filed: Mar. 31, 2021

(65) Prior Publication Data
US 2022/0077083 A1 Mar. 10, 2022

(30) Foreign Application Priority Data
Sep. 7, 2020 (TW) ................................. 109130643

(51) Int. Cl.
*H01L 23/66* (2006.01)
*H01L 23/50* (2006.01)
*H01L 27/01* (2006.01)

(52) U.S. Cl.
CPC .............. *H01L 23/66* (2013.01); *H01L 23/50* (2013.01); *H01L 27/01* (2013.01); *H01L 2223/6655* (2013.01)

(58) Field of Classification Search
CPC . H01L 2223/6655; H01L 27/01; H01L 23/50; H01L 23/66
See application file for complete search history.

(56) References Cited

U.S. PATENT DOCUMENTS

2009/0261935 A1* 10/2009 Hisamitsu ........... H01F 17/0006
                                                              336/200
2017/0338034 A1* 11/2017 Yun ........................ H03H 7/466

FOREIGN PATENT DOCUMENTS

TW        201541476 A     11/2015
TW        201935497 A      9/2019

OTHER PUBLICATIONS

English Abstract of TW201541476A.
English Abstract of TW201935497A.
Jaeh Kim, Jeong-Kyoum Kim, Bong-Joon Lee, and Deog-Kyoon Jeong, Design Optimization of On-Chip Inductive Peaking Structures for 0.13-μm CMOS 40-Gb/s Transmitter Circuits, IEEE Transactions on Circuits and Systems-I: regular papers, vol. 56, No. 12, Dec. 2009.
David J. Allstot, Sudip Shekhar, and Jeffrey S. Walling, Bandwidth extension techniques for CMOS amplifiers, p. 38-49.
Xiaoyong Li, Sudip Shekhar, and Davie J. Allstot, Low-Power gm-boosted LNA and VCO Circuits in 0.18μm CMOS, IEEE J. Solid-State Circuits Conference, Feb. 2005, pp. 534, 535, 615.

(Continued)

*Primary Examiner* — Samuel A Gebremariam
(74) *Attorney, Agent, or Firm* — WPAT, P.C.; Anthony King

(57) ABSTRACT

A semiconductor structure includes a first inductor, a second inductor, and a first input/output (I/O) pad. The first I/O pad is coupled to the first inductor and the second inductor. The first I/O pad, a first central axis of a first magnetic field of the first inductor, and a second central axis of a second magnetic field of the second inductor are disposed sequentially along a first direction.

20 Claims, 8 Drawing Sheets

(56) References Cited

OTHER PUBLICATIONS

Xiaoyong Li, Sudip Shekhar, and Davie J. Allstot, Gm-Boosted Common-Gate LNA and Differential Colpitts VCO/QVCO in 0.18μm Cmos, IEEE J. of Solid-State Circuits, vol. 40, No. 12, Dec. 2005.
W. Zhuo, X. Li, S. Shekhar, S. H. K. Embabi, J. Pineda De Gyvex, D. J. Allstot, and E. Sanchez-Sinencio, A Capacitor Cross-Coupled Common-Gate Low-Noise Amplifier, IEEE Transactions on Circuits and Systems-II: Express Brieds, vol. 52, No. 12, Dec. 2005.
Sudip Shekhar, Jeffery S. Walling, David J. Allstot, Bandwidth Extension Techniques for CMOS Amplifiers, IEEE J. of Solid-state Circuits, vol. 41, No. 11, Nov. 2006.

\* cited by examiner

SEMICONDUCTOR STRUCTURE

CROSS-REFERENCE TO RELATED APPLICATIONS

This application claims the benefit of priority to Patent Application No. 109130643, filed in Taiwan on Sep. 7, 2020, which is incorporated by reference in its entirety.

TECHNICAL FIELD

The present application relates to a semiconductor structure; in particular; to the semiconductor structure of an integrated inductor.

BACKGROUND

Inductors are important components used in integrated circuits to achieve functions such as impedance matching. With the advancement of integrated circuits, integrated inductors have replaced conventional discrete components gradually and been widely used in integrated circuits. However, when the size of integrated circuits become smaller, the complexity of the manufacturing process has increased, and the importance of the arrangement of components in the integrated circuit has increased as well. Hence, how to maintain the equivalent performance while at the same time using smaller area to accommodate the integrated inductor and without increasing the complexity of the manufacturing process has become a critical issue in the field.

SUMMARY OF THE INVENTION

Some embodiments of the present disclosure provide a semiconductor structure including a first inductor, a second inductor, and a first input/output (I/O) pad. The first I/O pad is coupled to the first inductor and the second inductor. The first I/O pad, a first central axis of a first magnetic field of the first inductor, and a second central axis of a second magnetic field of the second inductor are disposed sequentially along a first direction.

Some embodiments of the present disclosure provide a semiconductor structure including a first inductor and a second inductor. The first inductor has a first part, a second part, and a third part. The second inductor has a fourth part, a fifth part, and a sixth part. The first part, the second part, and the third part surround the fourth part. The fourth part, the fifth part, and the sixth part surround the first part.

The semiconductor structure according to embodiments of the present disclosure can be used to dispose integrated inductor in a smaller area without jeopardizing the performance and form a symmetrical structure. Compared with the prior art, the semiconductor structure according to embodiments of the present disclosure can reduce the area occupied by the integrated inductors, and because it has a symmetrical structure, the complexity of manufacturing the integrated inductor is reduced.

DETAILED DESCRIPTION

Figure 1:
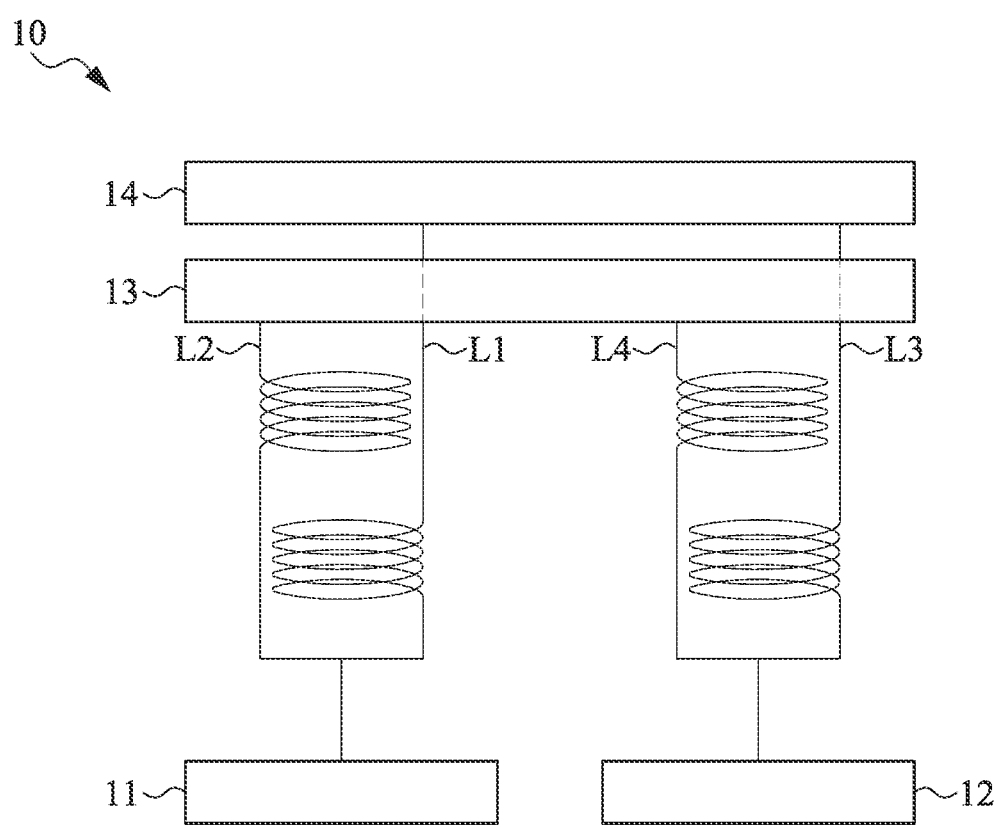
FIG. 1 is a schematic diagram illustrating a semiconductor structure according to some embodiments of the present disclosure.

Reference is made to FIG. 1. FIG. 1 is a schematic diagram illustrating a semiconductor structure 10 according to some embodiments of the present disclosure. The semiconductor structure 10 is configured to reduce the attenuation of the high-frequency signal through the input/output (I/O) pads in the integrated circuit; in other words, it can increase the signal bandwidth and high-frequency gain. In FIG. 1, the semiconductor structure 10 includes two I/O pads (i.e. I/O pad 11, I/O pad 12) respectively corresponding to two inductors (I/O pad 11 corresponds and is coupled to the inductors L1 and L2; I/O pad 12 corresponds and is coupled to the inductors L3 and L4), the inductors L1 and L3 are coupled to the circuit 14; the inductors L2 and L4 are coupled to the circuit 13. In some embodiments, the circuit 13 and the circuit 14 can be a transmitter circuit or a receiver circuit; however, the present disclosure is not limited thereto. It is noted that the embodiment shown in FIG. 1 is not intended to limit the number of the I/O pads, and the basic unit of the semiconductor structure of the present disclosure is one I/O pad and two corresponding inductors; wherein two I/O pads are shown in FIG. 1 to clearly demonstrate the relative positions of the components.

Take the I/O pad 11 for example, by changing the inductance of the inductor L1 and the inductor L2, it is feasible to change the input impedance of the signal, and hence, impedance matching can be achieved by using an appropriate design, so as to increase the bandwidth of the signal and high-frequency gain, as described above; in the related field, the inductor L1 and the inductor L2 are also known as the peaking inductor. In some embodiments, the inductor L1 and the inductor L2 may have substantially identical or different inductance. With the advancement of the manufacturing process, the area of the die becomes smaller, and hence, the width of the I/O pad and the distance between I/O pads are decreased as well. The inductive structure of the present disclosure reduces the overall area of the inductor L1 and the inductor L2 so that the inductor L1 and the inductor L2 as a whole have shorter widths to match the width and I/O pad spacing of today's narrower I/O pads without allowing the peaking inductor to restrict the I/O pad placement.

Figure 2:
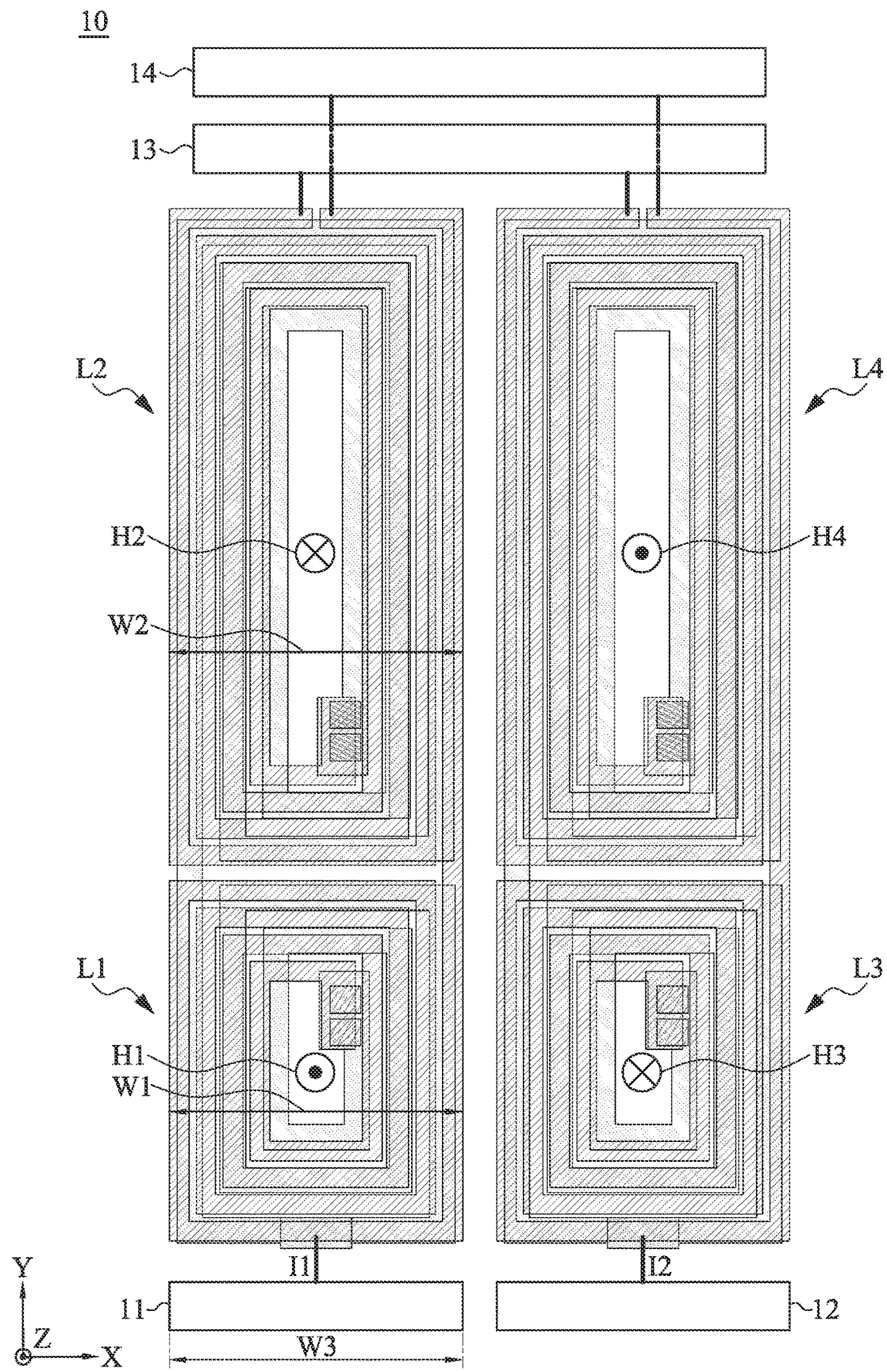
FIG. 2 is a schematic diagram illustrating a semiconductor structure according to some embodiments of the present disclosure.

FIG. 2 is a schematic diagram illustrating a semiconductor structure 10 according to some embodiments of the present disclosure, wherein inductors L1~L4 are expressed as the layout to facilitate the discussion of the present disclosure. Reference symbols H1, H2, H3 and H4 respectively represent the approximate position of a central axis of the magnetic field generated by inductors L1-L4 when a signal is passing through. As shown in FIG. 2, the I/O pad 11, the central axis of the magnetic field H1 and the central axis of the magnetic field H2 are sequentially arranged along the Y direction; the I/O pad 12, the central axis of the magnetic field H3 and the central axis of the magnetic field H4 are sequentially arranged along the Y direction. The central axis of the magnetic field H1 and the central axis of the magnetic field H3 are sequentially arranged along the X direction; the central axis of the magnetic field H2 and the central axis of the magnetic field H4 are sequentially arranged along the X direction.

The inductor L1, inductor L2 and I/O pad 11 respectively have a width W1, width W2 and width W3 in the X direction. In some embodiments, widths W1 and W2 are no greater than W3. In some embodiments, as shown in FIG. 2, the widths W1 and W2 are substantially the same. In some embodiments, the size and structure of the I/O pad 11, the inductor L1 and the inductor L2 are substantially the same as the size and structure of the I/O pad 12, the inductor L3 and the inductor L4.

Figure 3A:
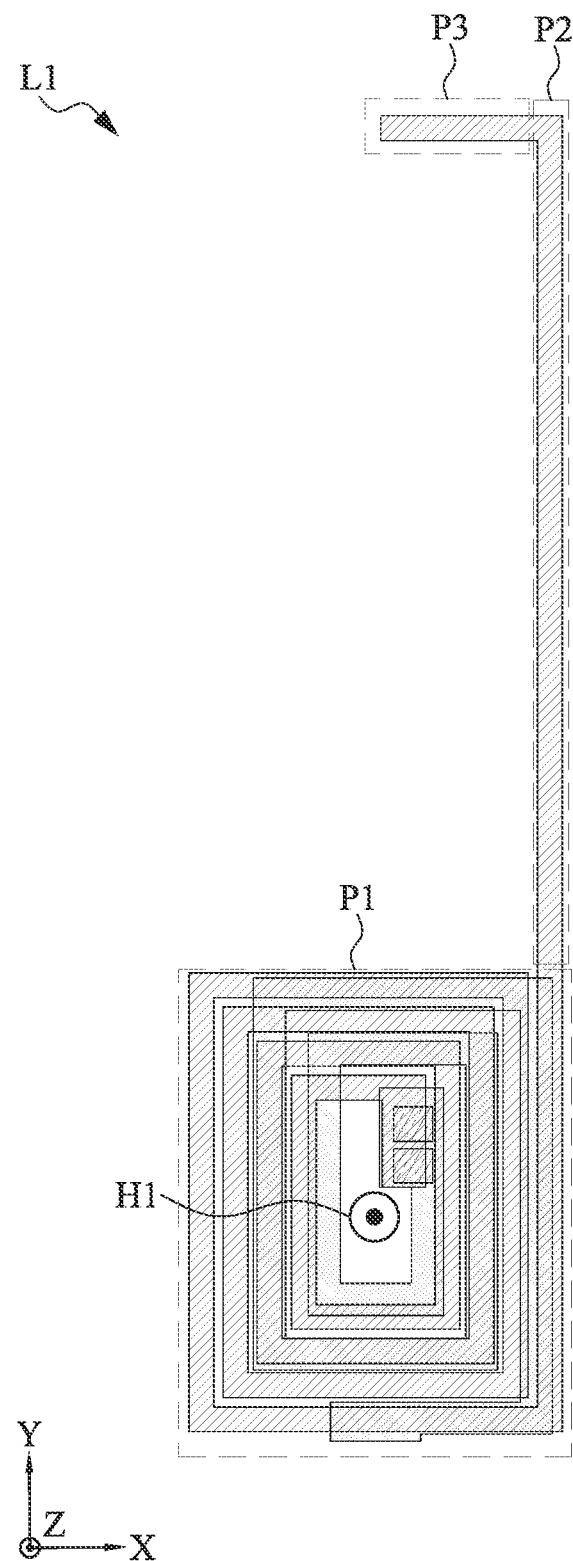
FIGS. 3A-3D are layouts of inductor structures according to some embodiments of the present disclosure.
Figure 3B:
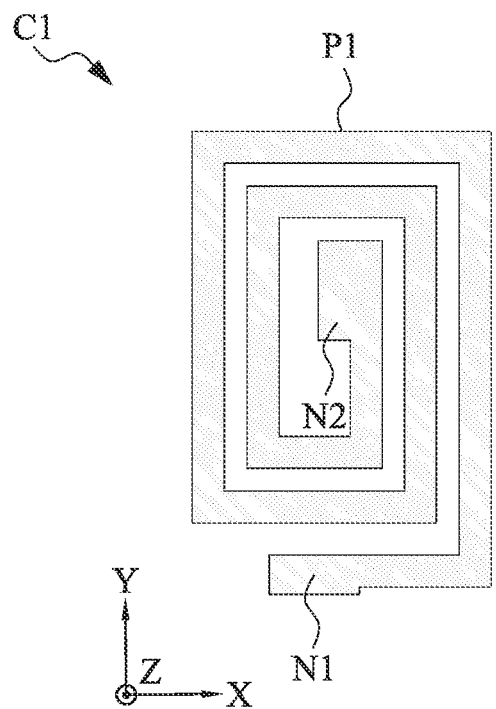
Figure 3C:
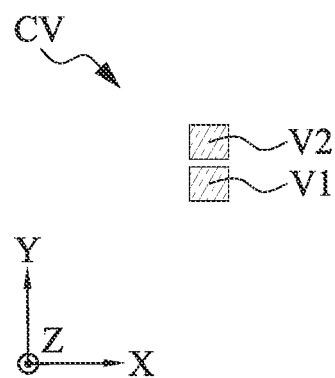
Figure 3D:
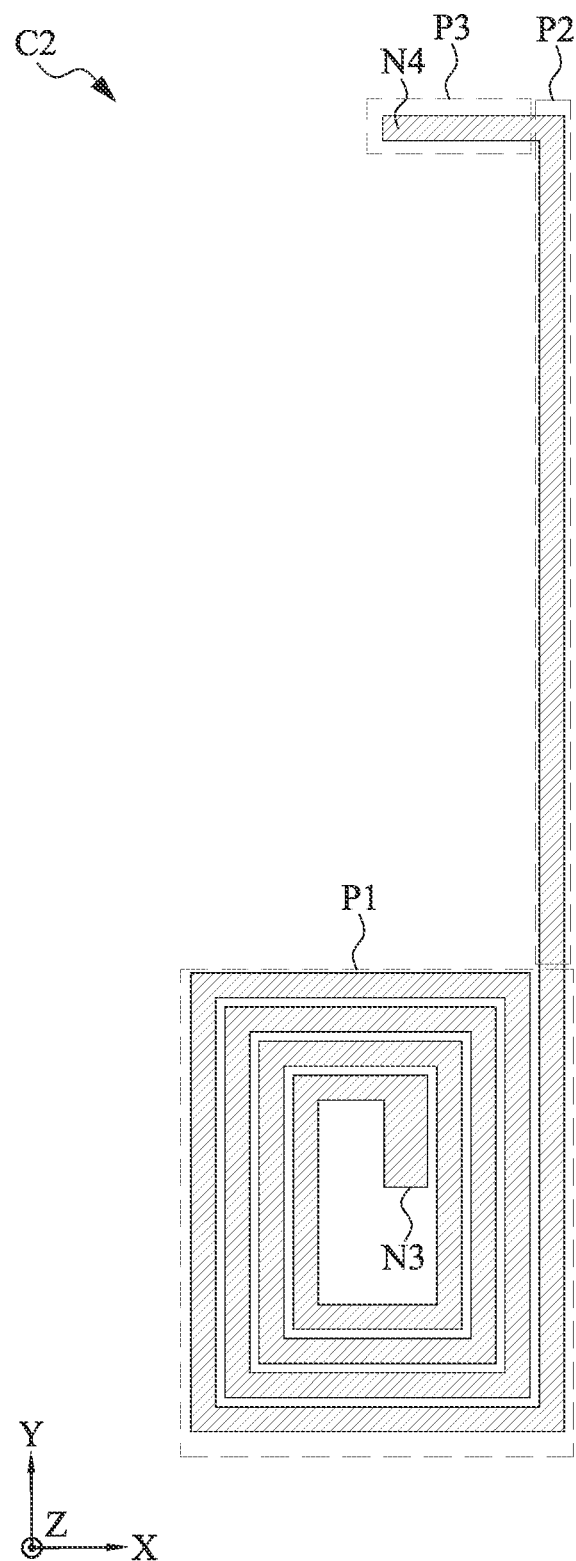

The inductor L1 and L2 are disposed in multiple conductive layers; FIG. 3A~3D are top-view layouts showing the structure of each part of the inductor L1 (as shown in FIG. 2) according to the present embodiment in different conductive layers; FIGS. 4A~4D are layouts showing the structure of each part of the inductor L2 (as shown in FIG. 2) according to the present embodiment in different conductive layers. Specifically, FIG. 3A illustrates the layout of the complete winding of the inductor L1 on the conductive layer C1 and the conductive layer C2 (shown in an overlapped view); FIG. 3B illustrates only the layout of the winding of the inductor L1 on the conductive layer C1; FIG. 3C illustrates only the layout of the via of the inductor L1 on the connecting layer CV, wherein the connecting layer CV is disposed between the conductive layer C1 and the conductive layer C2; FIG. 3D illustrates only the layout of the winding of the inductor L1 on the conductive layer C2.

Referring to FIG. 3A-3D, the inductor L1 includes a first part P1, a second part P2 and a third part P3. The first part P1 is the main coil part of the inductor L1, wherein the winding disposed at the conductive layer C1 is shown in FIG. 3B, and the winding disposed at the conductive layer C2 is shown in FIG. 3D. The second part P2 and the third part P3 are disposed at the conductive layer C2, as shown in FIG. 3D. The conductive layer C1 and the conductive layer C2 are disposed on the substrate (not shown), and the conductive layer C1 is disposed on the conductive layer C2; that is, the conductive layer C2 is disposed between the substrate and the conductive layer C1. In the present embodiment, the conductive layer C1 includes aluminum, such as an aluminum redistribution layer (AL-RDL); the conductive layer C2 includes copper and is disposed at the top of the multi-layered copper layers, such as an ultra-thick metal (UTM) layer including copper. However, the present disclosure is not limited thereto; in some embodiments, both the conductive layer C1 and the conductive layer C2 can be copper layers. The conductive layer C1 is coupled to the conductive layer C2 through the connecting layer CV; in the present embodiment, the winding of the inductor L1 disposed on the conductive layer C1 and the winding of the inductor L1 disposed on the conductive layer C2 are connected through the via V1 and the via V2 of the connecting layer CV.

The number of turns of the winding of the first part P1 of the inductor L1 disposed in the conductive layer C1 and the number of turns of the winding of the first part P1 of the inductor L1 disposed in the conductive layer C2 can be varied as needed. Referring to FIG. 3B, which more clearly shows that the winding of the first part P1 disposed on the conductive layer C1 has a terminal N1 and a terminal N2, wherein the terminal N1 is configured to couple the I/O pad 11 shown in the preceding embodiment (as shown in FIGS. 1-2), and the terminal N2 is coupled to the winding of the first part P1 disposed on the conductive layer C2 (as shown in FIG. 3D) through the via V1 and the via V2 shown in FIG. 3C. Referring to FIG. 3D, which more clearly shows that the winding of the first part P1 disposed on the conductive layer C2 has a terminal N3, wherein the terminal N3 is coupled to the winding of the first part P1 disposed in the conductive layer C1 layer (as shown in FIG. 3B) through the via V1 and the via V2 of FIG. 3C. The second part P2 and the third part P3 are the extension part of the inductor L1. The first part P1 of the inductor L1 is connected to the second part P2 and the third part P3 at the conductive layer C2, the third part P3 has a terminal N4 coupled to the circuit 14. With the above-mentioned arrangement; the I/O pad 11 is coupled to the inductor L1 through the conductive layer C1, and the inductor L1 is coupled to the circuit 14 shown in the above embodiment (as shown in FIGS. 1-2) through the conductive layer C2.

In the present embodiment, depending on the winding direction of the winding of the inductor L1, when the signal, in the form of a positive current, enters the inductor L1 from the terminal N1 and exits the inductor L1 from the terminal N4, a magnetic field having a Z direction (a counterclockwise current creates the direction passing through the drawing plane based on the right-hand rule) is generated at the central axis H1 of the magnetic field of the inductor L1.

Figure 4A:
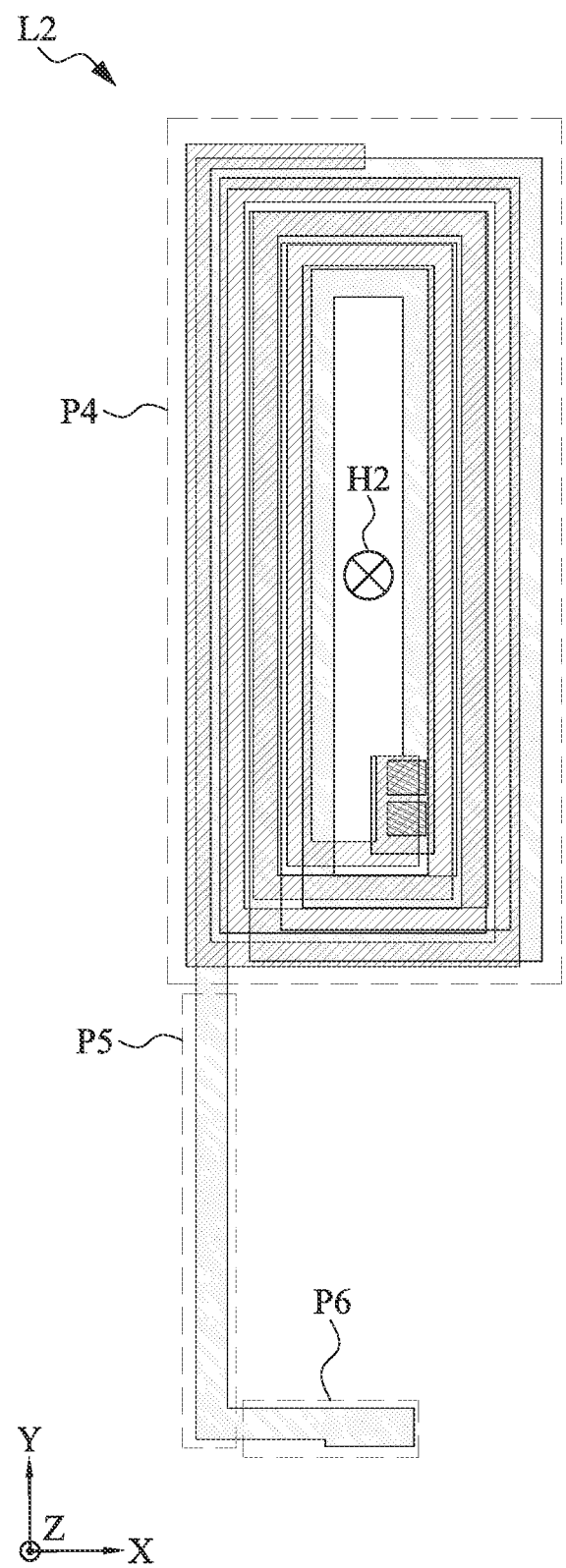
FIGS. 4A-4D are layouts of inductor structures according to some embodiments of the present disclosure.
Figure 4B:
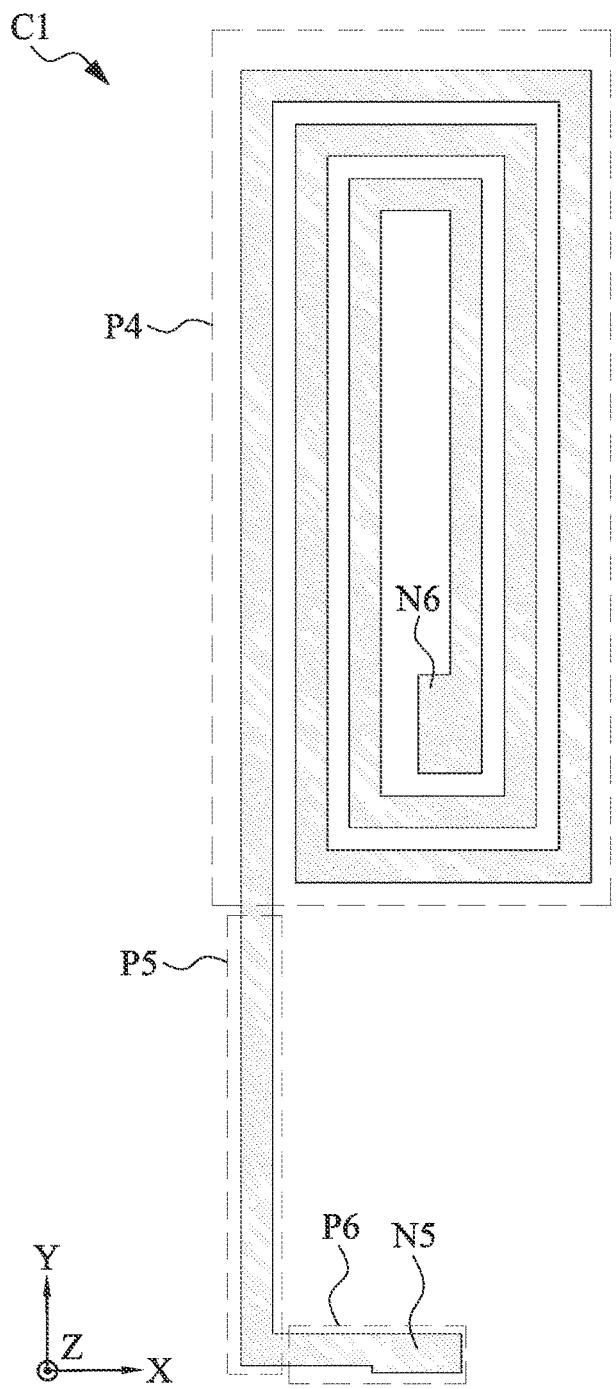
Figure 4C:
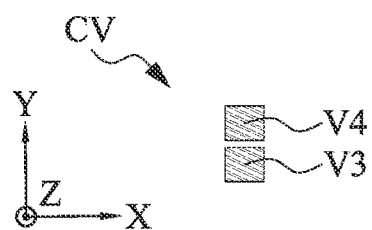

Similarly, FIG. 4A illustrates the layout of the complete winding of the inductor L2 on the conductive layer C1 and the conductive layer C2 (shown in an overlapped view); FIG. 4B illustrates only the layout of the winding of the inductor L2 on the conductive layer C1; FIG. 4C illustrates only the layout of the via of the inductor L2 on the connecting layer CV, wherein the connecting layer CV is disposed between the conductive layer C1 and the conductive layer C2; FIG. 41D illustrates only the layout of the winding of the inductor L2 on the conductive layer C2.

Figure 4D:
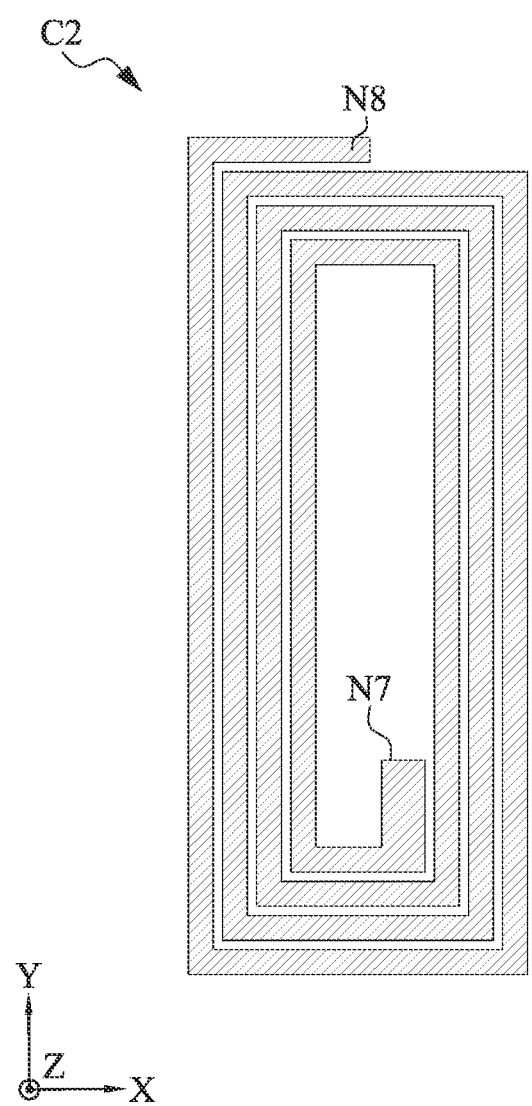

Referring to FIGS. 4A-4D, the inductor L2 includes a fourth part P4, a fifth part P5 and a sixth part P6. The fourth part P4 is the main coil part of the inductor L2, wherein the winding disposed at the conductive layer C1 is shown in FIG. 4B, and the winding disposed at the conductive layer C2 is shown in FIG. 4D. The fifth part P5 and the sixth part P6 are disposed at the conductive layer C2, as shown in FIG. 4D. The conductive layer C1 is coupled to the conductive layer C2 through the connecting layer CV; in the present embodiment, the winding of the inductor L2 disposed on the conductive layer C1 is connected with the winding of the inductor L2 disposed on the conductive layer C2 through the via V3 and the via. V4 of the connecting layer CV.

The number of turns of the winding of the fourth part P4 of the inductor L2 disposed at the conductive layer C1 and that at the conductive layer C2 may be varied as needed. The fifth part P5 and the sixth part P6 are the extension part of the inductor L2. Referring to FIG. 4B, which more clearly shows that the winding of the fourth part P4 disposed on the conductive layer C1 is connected with the fifth part P5 and the sixth part P6 at the conductive layer C1; the sixth part P6 having a terminal N5 is coupled to the I/O pad 11 of the above-mentioned embodiments (as shown in FIG. 1 and FIG. 2); the fourth part P4 further has a terminal N6, wherein the terminal N6 is coupled to the winding of the fourth part P4 disposed on the conductive layer C2 (as shown in FIG. 4D) through the via V3 and the via V4 of FIG. 4C. Referring to FIG. 4D, which more clearly shows that the winding of the fourth part P4 disposed on the conductive layer C2 has a terminal N7 and a terminal N8, wherein the terminal N7 is coupled to the winding of the fourth part P4 disposed on the conductive layer C1 (as shown in FIG. 4B) through the via V3 and the via V4 of FIG. 4C, and the terminal N8 is coupled to the circuit 13 of the above-mentioned embodiments (as shown in FIG. 1 and FIG. 2). With the above-mentioned arrangement, the I/O pad 11 is coupled to the inductor L2 through the conductive layer C1, and the inductor L2 is coupled to the circuit 13 through the conductive layer C2.

In the present embodiment, depending on the winding direction of the winding of the inductor L2, when the signal, in the form of a positive current, enters the inductor from the terminal N5 and exits the inductor L2 from the terminal N8, a magnetic field having a −Z direction (a clockwise current creates the direction passing through the drawing plane based on the right-hand rule) is generated at the central axis H2 of the magnetic field of the inductor L2.

Therefore, referring to both FIGS. 3A and 4A, it is shown that the first part P1, the second part P2 and the third part P3 surround three sides of the fourth part P4; and the fourth part P4, the fifth part P5 and the sixth part P6 surround three sides of the first part P1. Since both the terminal N1 of the inductor L1 and the terminal N5 of the inductor L2 are coupled to the I/O pad 11, the terminal N1 and the terminal N5 may be co-located in some embodiments. On the other hand, the terminal N4 of the inductor L1 and the terminal N8 of the inductor L2 are adjacent but electrically isolated from each other.

The inductor L1 and the inductor L2 receives the signal at the I/O pad 11, depending on the direction of the windings of the inductor L1 and the inductor L2, the direction of the magnetic field generated by the inductor L1 is opposite to that generated by the inductor L2. In general, high-frequency signals are input to the chip in the form of differential signals. For example, as shown in FIG. 2, the pad I/O 11 and the Pad I/O 12 are differential pairs, so the current I1 flowing into the inductor L1 and the inductor L2 is opposite to the current I2 flowing into the inductor L3 and inductor L4. For example, the current I1 is positive and the current I2 is negative, so the magnetic field direction shown in FIG. 2 is generated, that is, the central axis H1 and the central axis H4 of the magnetic field generate the magnetic field along the Z direction; and the central axis H2 and the central axis H3 of the magnetic field generate a magnetic field along the −Z direction. In this way, the magnetic field generated by each inductor is in the opposite direction to that generated by adjacent inductors. For example, the magnetic field generated by the inductor L1 is in the opposite direction to that generated by adjacent inductors L2 and L3, which helps to suppress the magnetic field radiation so as to avoid interference with other electronic components. Therefore, it is no longer necessary to change the design of the peaking inductance corresponding to the adjacent I/O pad in order to reduce the electromagnetic wave, but the basic units of the semiconductor structure in this application, namely the inductors L1 and L2 (or the inductors L3 and L4), can be duplicated entirely.

In view of the foregoing, in some embodiments, the size and structure of the I/O pad 11, the inductor L1 and the inductor L2 are substantially the same as the size and structure of the I/O pad 12, the inductor L3 and the inductor L4. Hence, persons having ordinary skill in the art should readily understand the implementation of the inductor L3 and the inductor IA in view of the detailed descriptions regarding the inductor L1 and the inductor L2 in the above embodiments, and hence, detailed descriptions thereof are omitted hereinafter.

What is claimed is:

1. A semiconductor structure, comprising:
   a first inductor;
   a second inductor; and
   a first input/output (I/O) pad, coupled to the first inductor and the second inductor,
   wherein, the first I/O pad, a first central axis of a first magnetic field of the first inductor and a second central axis of a second magnetic field of the second inductor are disposed sequentially along a first direction, and from a top view perspective, the first central axis and the second central axis are along directions passing through the drawing plane, and the first central axis is disposed between the first I/O pad and the second central axis from the top view perspective.

2. The semiconductor structure of claim 1, wherein a direction of the first magnetic field generated by the first inductor is opposite to a direction of the second magnetic field generated by the second inductor.

3. The semiconductor structure of claim 1, wherein the first inductor, the second inductor and the first I/O pad respectively have a first width, a second width and a third width along a second direction perpendicular to the first direction,
   wherein the first width and the second width are smaller than or equal to the third width.

4. The semiconductor structure of claim 1, further comprising:
   a first circuit, coupled to the first inductor; and
   a second circuit, coupled to the second inductor.

5. The semiconductor structure of claim 1, wherein the first inductor and the second inductor are disposed on a first conductive layer and a second conductive layer alternatingly, wherein, the first I/O pad is coupled to the first inductor and the second inductor via the first conductive layer.

6. The semiconductor structure of claim 5, wherein the first conductive layer comprises aluminum, and the second conductive layer comprises copper.

7. The semiconductor structure of claim 5, further comprising a substrate, wherein the second conductive layer is disposed between the first conductive layer and the substrate.

8. The semiconductor structure of claim 1, wherein a first inductance of the first inductor differs from a second inductance of the second inductor.

9. The semiconductor structure of claim 1, further comprising:
   a third inductor; and
   a fourth inductor,
   wherein the third inductor and the first inductor are substantially identical, and the fourth inductor and the second inductor are substantially identical, and
   the third inductor is adjacent to the first inductor, and the fourth inductor is adjacent to the second inductor.

10. The semiconductor structure of claim 9, further comprising:
    a second I/O pad, coupled to the third inductor and the fourth inductor, wherein the second I/O pad, a third central axis of a third magnetic field of the third inductor and a fourth central axis of a fourth magnetic field of the fourth inductor are disposed sequentially along the first direction.

11. A semiconductor structure, comprising:
    a first inductor, having a first part, a second part and a third part; and
    a second inductor, having a fourth part, a fifth part and a sixth part,
    wherein the first part, the second part and the third part surround the fourth part, and the fourth part, the fifth part and the sixth part surround the first part,
    wherein a portion of the first part and a portion of the fourth part are disposed at a first conductive layer, and an another portion of the first part and an another portion of the fourth part are disposed at a second conductive layer different from the first conductive layer.

12. The semiconductor structure of claim 11, further comprising a substrate, wherein the first part is disposed at the first conductive layer and a second conductive layer of the semiconductor structure, and the second part and the third part are disposed at the second conductive layer, wherein the second conductive layer is disposed between the substrate and the first conductive layer.

13. The semiconductor structure of claim 12, wherein the fourth part is disposed at the first conductive layer and the second conductive layer, and the fifth part and the sixth part are disposed at the first conductive layer.

14. The semiconductor structure of claim 12, wherein a first terminal of the first inductor is coupled to a second terminal of the second inductor, and the semiconductor structure further comprises:
   a first I/O pad, coupled to the first terminal and the second terminal.

15. The semiconductor structure of claim 14, wherein the first terminal and the second terminal are disposed at the first conductive layer.

16. The semiconductor structure of claim 14, wherein a third terminal of the first inductor is located at the other side opposite to the first terminal, and a fourth terminal of the second inductor is located at the other side opposite to the second terminal.

17. The semiconductor structure of claim 16, wherein the third terminal and the fourth terminal are disposed at the second conductive layer.

18. The semiconductor structure of claim 14, wherein a first width of the first inductor and a second width of the second inductor are smaller than or equal to a pad width of first I/O pad.

19. The semiconductor structure of claim 14, further comprising:
   a third inductor;
   a fourth inductor; and
   a second I/O pad, coupled to the third inductor and the fourth inductor, wherein the first I/O pad, the first inductor and the second inductor are disposed in parallel with the second I/O pad, the third inductor and the fourth inductor.

20. The semiconductor structure of claim 19, wherein the first inductor and fourth inductor generates a magnetic field directed at a first direction, and the second inductor and third inductor generates a magnetic field directed at a second direction opposite to the first direction.

* * * * *